(12) United States Patent
Wang et al.

(10) Patent No.: US 7,796,459 B2
(45) Date of Patent: Sep. 14, 2010

(54) MEMORY VOLTAGE CONTROL CIRCUIT

(75) Inventors: Ning Wang, Shenzhen (CN); Cheng Qian, Shenzhen (CN); Yong-Zhao Huang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 207 days.

(21) Appl. No.: 12/057,377

(22) Filed: Mar. 28, 2008

(65) Prior Publication Data
US 2009/0161472 A1 Jun. 25, 2009

(30) Foreign Application Priority Data
Dec. 19, 2007 (CN) .................. 2007 1 0203217

(51) Int. Cl.
*G11C 5/14* (2006.01)
*G06F 1/00* (2006.01)
(52) U.S. Cl. .................. 365/226; 713/300; 713/310
(58) Field of Classification Search .................. 365/226; 713/300, 310
See application file for complete search history.

(56) References Cited

U.S. PATENT DOCUMENTS

| 6,621,754 | B1 * | 9/2003 | Chang | 365/226 |
| 7,301,847 | B2 * | 11/2007 | Kao et al. | 365/226 |
| 2002/0003740 | A1 * | 1/2002 | Chang et al. | 365/226 |
| 2008/0225499 | A1 * | 9/2008 | Meng et al. | 361/767 |
| 2009/0046418 | A1 * | 2/2009 | Chen et al. | 361/684 |

* cited by examiner

*Primary Examiner*—J. H. Hur
(74) *Attorney, Agent, or Firm*—Frank R. Niranjan

(57) ABSTRACT

A memory voltage control circuit includes two slots, a control circuit, a voltage conversion circuit, and a switch circuit. The two slots are able to efficiently process different memory types. The control circuit receives memory identification signals from the two slots. The control circuit administers the output voltage of the voltage conversion circuit according to the memory identification signals. The memory identification signals determine whether the switch circuit is to be turned on or off. This will control whether the output voltage of the voltage conversion circuit will go to the first or the second slot.

6 Claims, 2 Drawing Sheets

MEMORY VOLTAGE CONTROL CIRCUIT

BACKGROUND

1. Field of the Invention

The present invention relates to control circuits, and particularly to a memory voltage control circuit.

2. Description of Related Art

Currently, a typical personal computer is comprised of a motherboard, interface cards, and peripheral accessories. The motherboard is the heart of the personal computer. In addition to the central processing unit (CPU), the chip set and slots for installing the interface cards, the motherboard also includes slots for installing memory modules.

Due to constant changes in the computer industry, memories that are typically used in computers have changed from DDR2 (Double Data Ram II) to higher speed memory chips such as DDR3 (Double Data Ram III).

Because DDR2s are cheaper than DDR3s, DDR2s are still in demand in the market to be used on the main board. The difference in operating DDR2 versus DDR3 includes the following: DDR2 utilizes 1.8V VDD and 0.9V VTT, while DDR3 utilizes 1.5V VDD and 0.75V VTT. Currently, no motherboard is compatible with both DDR3 and DDR2.

What is desired, therefore, is a memory voltage control circuit that can simultaneously support different types of computer memory.

SUMMARY

An exemplary memory voltage control circuit includes two slots, a control circuit, a voltage conversion circuit, and a switch circuit. The two slots are able to efficiently process different memory types. The control circuit receives memory identification signals from the two slots. The control circuit administers the output voltage of the voltage conversion circuit according to the memory identification signals. The memory identification signals determine whether the switch circuit is to be turned on or off. This will control whether the output voltage of the voltage conversion circuit will go to the first or the second slot.

Other advantages and novel features of the present invention will become more apparent from the following detailed description of preferred embodiment when taken in conjunction with the accompanying drawings, in which:

DETAILED DESCRIPTION

Figure 1:
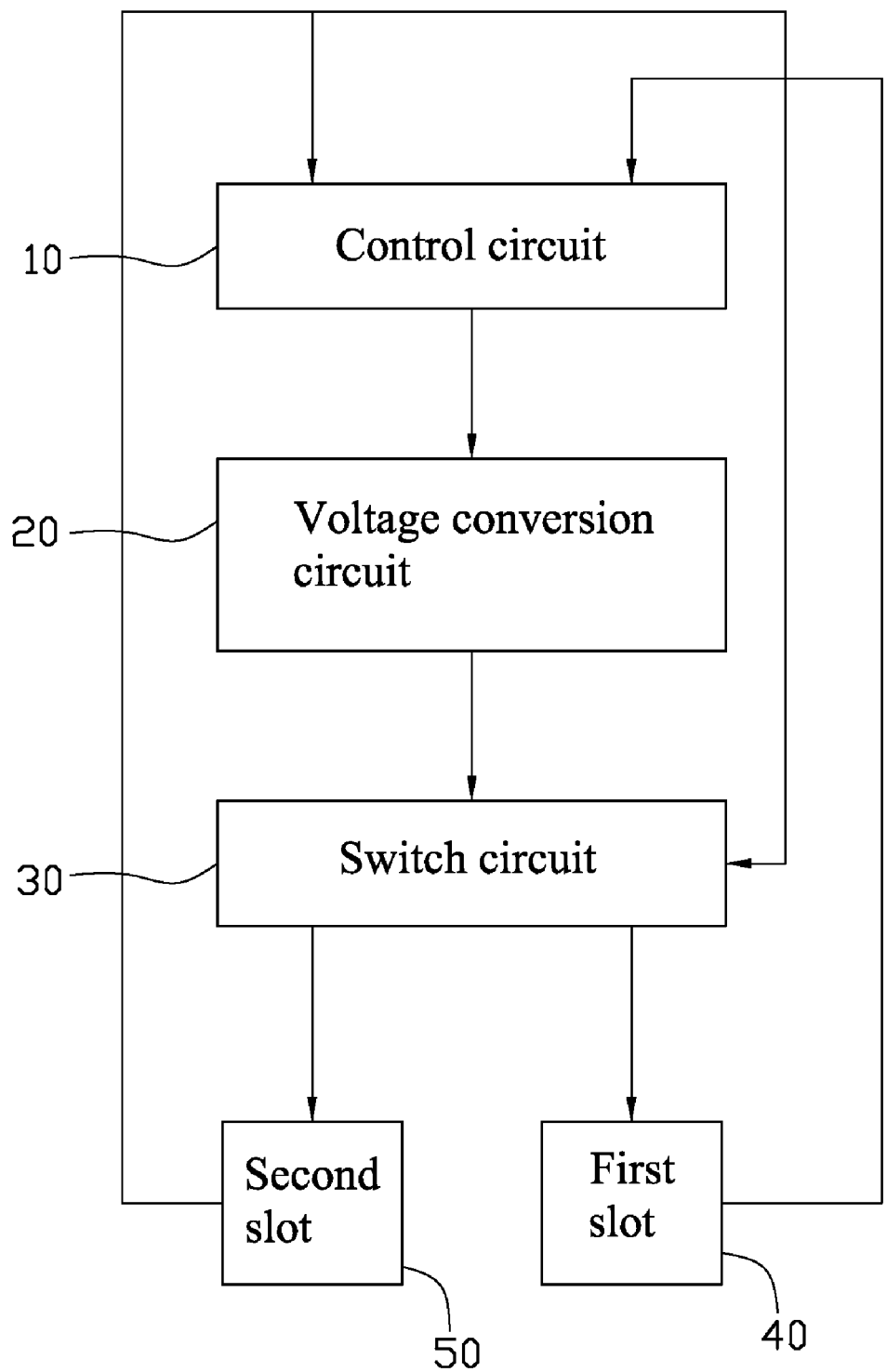
FIG. 1 is a block diagram of a memory voltage control circuit in accordance with an exemplary embodiment of the present invention.

Referring to FIG. 1, a memory voltage control circuit in accordance with an exemplary embodiment of the present invention includes a control circuit 10, a voltage conversion circuit 20, a switch circuit 30, a first slot 40 (for receiving a DDR2 memory for example), and a second slot 50 (for receiving a DDR3 memory for example). The control circuit 10 receives memory identification signals from the two slots 40, 50 and controls the output of the voltage conversion circuit 20 based on the memory identification signals. The memory identification signal of the second slot 50 determines whether the switch circuit 30 is to be turned on or off. This will control whether the output of the voltage conversion circuit 20 will go to the first slot 40 or the second slot 50.

Figure 2:
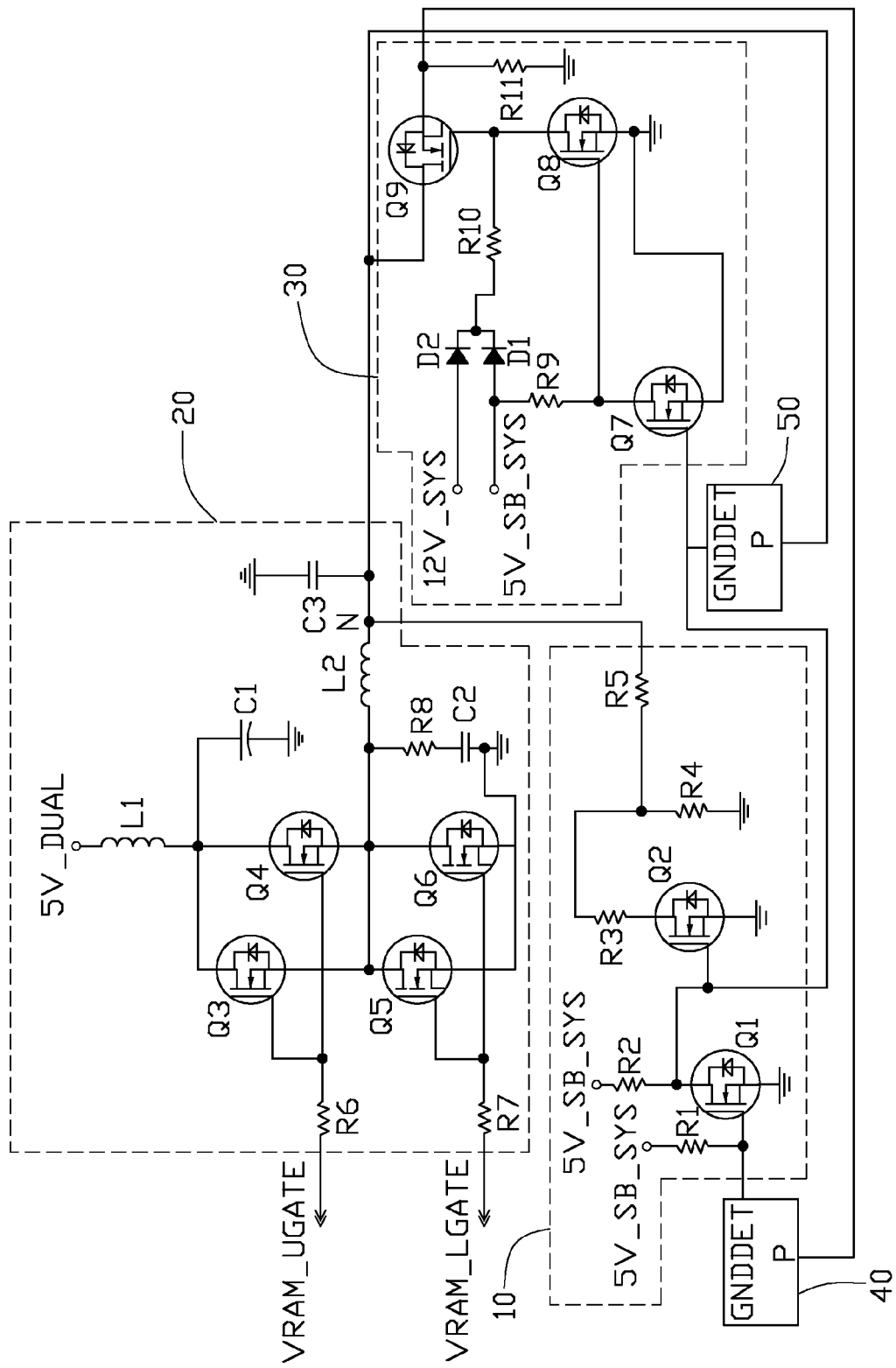
FIG. 2 is a circuit diagram of FIG. 1.

Referring to FIG. 2, the control circuit 10 includes five resistors R1-R5 and two field effect transistors (FETs) Q1 and Q2. The gate of the FET Q1 is connected to a memory identification pin GNDDET of the first slot 40, and connected to the system standby power source 5V_SB_SYS via the resistor R1. The source of the FET Q1 is grounded. The drain of the FET Q1 is connected to the system standby power source 5V_SB_SYS via the resistor R2. A memory identification pin GNDDET of the second slot 50 is connected to the drain of the FET Q1 and the gate of the FET Q2. The source of the FET Q2 is grounded. The drain of the FET Q2 is grounded via the resistors R3 and R4 connected in series. A node between the resistors R3 and R4 is connected to an output N of the voltage conversion circuit 20 via the resistor R5.

The voltage conversion circuit 20 includes four FETs Q3~Q6, three resistors R6~R8, three capacitors C1~C3, and two inductances L1 and L2. The gate of the FET Q3 is connected to the gate of the FET Q4, as well as a gating pin VRAM_UGATE of a power regulator (not shown) via the resistor R6. A node between the drain of the FET Q3 and the drain of the FET Q4 is grounded via the capacitor C1, and is also connected to a dual power source 5V_DUAL via the inductance L1. A node between the source of the FET Q3 and the drain of the FET Q5 is connected to a node between the source of the FET Q4 and the drain of the FET Q6, and grounded via the resistor R8 and the capacitor C2 connected in series, and connected to the output N via the inductance L2. The output N is grounded via the capacitor C3. The gate of the FET Q5 is connected to the gate of the FET Q6, and is also connected to a gating pin VRAM_LGATE of the power regulator via the resistor R7. The sources of the FETs Q5 and Q6 are grounded. The gating pins VRAM_UGATE and VRAM_LGATE of the power regulator respectively receive control signals to the voltage conversion circuit 20.

The switch circuit 30 includes three FETs Q7~Q9, three resistors R9~R11, and two diodes D1 and D2. The gate of the FET Q7 is connected to a memory identification pin GNDDET of the second slot 50. The sources of the FETs Q7 and Q8 are grounded. The drain of the FET Q7 is connected to the gate of the FET Q8, and connected to the anode of the diode D1 via the resistor R9. The anode of the diode D1 is connected to the system standby power source 5V_SB_SYS. The anode of the diode D2 is connected to a system power source 12V_SYS. A node between the cathode of the diode D1 and the cathode of the diode D2 is connected to a node between the drain of the FET Q8 and the gate of the FET Q9 via the resistor R10. The drain of the FET Q9 is connected to the power input pin P of the second slot 50 and the output N. The source of the FET Q9 is connected to the power input pin P of the first slot 40, and grounded via the resistor R11.

When only the DDR3 memory is plugged into the second slot 50, the memory identification pin GNDDET of the second slot 50 outputs a low level memory identification signal. The FET Q1 is turned on. The FET Q2 is turned off. The FETs Q7 and Q9 are turned off. The FET Q8 is turned on. The voltage conversion circuit 20 outputs a 1.5V voltage to the power input pin P of the second slot 50 via the voltage divider resistors R4 and R5.

When only the DDR2 memory is plugged into the first slot 40, the memory identification pin GNDDET of the first slot 40 outputs a low level memory identification signal. The FET Q1 is turned off. The FET Q2 is turned on. The FETs Q7 and Q9 are turned on. The FET Q8 is turned off. The voltage conversion circuit 20 outputs a 1.8V voltage to the power input pin P of the first slot 40 via the voltage divider resistors R3, R4, and R5.

When the DDR3 memory is plugged into the second slot 50, and the DDR2 memory is plugged into the first slot 40, the memory identification pin GNDDET of both slots 40, 50 output a low level memory identification signal. The FETs Q1 and Q2 are turned off. The FETs Q7 and Q9 are turned off. The FET Q8 is turned on. The voltage conversion circuit 20 outputs a 1.5V voltage to the power input pin P of the second slot 50. The motherboard functions normally.

The control circuit 10 of the memory voltage control circuit receives memory identification signals from the two slots 40, 50 and controls the output voltage of the voltage conversion circuit 20 accordingly based on the memory identification signals. At the same time, the memory identification signals determine whether the switch circuit 30 is to be turned on or off. In turn, this governs whether the output voltage of the voltage conversion circuit 20 goes to slot 40 or slot 50.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A memory voltage control circuit comprising:
   a first slot arranged for a first type of memory plugged thereinto;
   a second slot arranged for a second type of memory plugged thereinto;
   a control circuit receiving memory identification signals from the first slot and the second slot, the control circuit comprising first and second field effect transistors (FETs), the first FET and the second FET respectively having a gate and a drain, the gate of the first FET being connected to a memory identification pin of the first slot and connected to a system standby power source via a first resistor, the drain of the first FET being connected to the gate of the second FET, to a memory identification pin of the second slot, and to the system standby power source via a second resistor, the drain of the second FET being grounded via third and fourth resistors connected in series, an output of the voltage conversion circuit being connected to a node between the serial third and fourth resistors via a fifth resistor;
   a voltage conversion circuit, the control circuit administering the output voltage of the voltage conversion circuit according to the memory identification signals; and
   a switch circuit, the memory identification signals determining whether the switch circuit to be turned on or off, the on or off state of the switch circuit controlling whether the output voltage of the voltage conversion circuit is to be supplied to the first or the second slot.

2. The memory voltage control circuit as claimed in claim 1, wherein the voltage conversion circuit comprises a first FET, a second FET, a third FET, and a fourth FET, the first FET, the second FET, the third FET, and the fourth FET each having a gate, a drain, and a source, the gate of the first FET is connected to the gate of the second FET, and to a first gating pin of a power regulator via a first resistor, a first node between the drain of the first FET and the drain of the second FET is grounded via a first capacitor, the first node being connected to a dual power source via a first inductor, a second node between the source of the first FET and the drain of the third FET being connected to a third node between the source of the second FET and the drain of the fourth FET, the second node further being grounded via a second resistor and a second capacitor connected in series and being connected to the output of the voltage conversion circuit via a second inductor, the output of the voltage conversion circuit being grounded via a third capacitor, the gate of the third FET being connected to the gate of the fourth FET and being connected to a second gating pin of the power regulator via a third resistor.

3. The memory voltage control circuit as claimed in claim 1, wherein the switch circuit comprises a first FET, a second FET, a third FET, a first diode, and a second diode, the first FET, the second FET, and the third FET respectively having a gate, a drain, and a source, the gate of the first FET being connected to the memory identification pin of the second slot, the drain of the first FET being connected to the gate of the second FET and being connected to the anode of the first diode via a first resistor, the anode of the first diode being connected to the system standby power source, the anode of the second diode being connected to a system power source, a node between the cathode of the first diode and the cathode of the second diode being connected to a node between the drain of the second FET and the gate of the third FET via a second resistor, the drain of the third FET being connected to a power input pin of the second slot and the output of the voltage conversion circuit, the source of the third FET being connected to a power input pin of the first slot and grounded via a third resistor.

4. The memory voltage control circuit as claimed in claim 1, wherein the first slot is a DDR2 memory slot, and the second slot is a DDR3 memory slot.

5. A memory voltage control circuit comprising:
   a first slot arranged for a first type of memory plugged thereinto;
   a second slot arranged for a second type of memory plugged thereinto;
   a control circuit receiving memory identification signals from the first slot and the second slot;
   a voltage conversion circuit, the control circuit administering the output voltage of the voltage conversion circuit according to the memory identification signals, the voltage conversion circuit comprising a first FET, a second FET, a third FET, and a fourth FET, the first FET, the second FET, the third FET, and the fourth FET respectively having a gate, a drain, and a source, the gate of the first FET being connected to the gate of the second FET and to a first gating pin of a power regulator via a first resistor, a node between the drain of the first FET and the drain of the second FET being grounded via a first capacitor and being connected to a dual power source via a first inductor, a node between the source of the first FET and the drain of the third FET being connected to a node between the source of the second FET and the drain of the fourth FET, and the node between the source of the first FET and the drain of the third FET further being grounded via a second resistor and a second capacitor connected in series and connected to an output of the voltage conversion circuit via a second inductor, the output of the voltage conversion circuit being grounded via a third capacitor, the gate of the third FET being connected to the gate of the fourth FET and to a second gating pin of the power regulator via a third resistor; and
   a switch circuit, the memory identification signals determining whether the switch circuit to be turned on or off, the on or off state of the switch circuit controlling whether the output voltage of the voltage conversion circuit is to be supplied to the first or the second slot.

6. A memory voltage control circuit comprising:

a first slot arranged for a first type of memory plugged thereinto;

a second slot arranged for a second type of memory plugged thereinto;

a control circuit receiving memory identification signals from the first slot and the second slot;

a voltage conversion circuit, the control circuit administering the output voltage of the voltage conversion circuit according to the memory identification signals; and a switch circuit, the memory identification signals determining whether the switch circuit to be turned on or off, the on or off state of the switch circuit controlling whether the output voltage of the voltage conversion circuit is to be supplied to the first or the second slot, the switch circuit comprising a first FET, a second FET, a third FET, a first diode, and a second diode, the first FET, the second FET, and the third FET respectively having a gate, a drain, and a source, the gate of the first FET being connected to a memory identification pin of the second slot, the drain of the first FET being connected to the gate of the second FET and to the anode of the first diode via a first resistor, the anode of the first diode being connected to a system standby power source, the anode of the second diode being connected to a system power source, a node between the cathode of the first diode and the cathode of the second diode being connected to a node between the drain of the second FET and the gate of the third FET via a second resistor, the drain of the third FET being connected to a power input pin of the second slot and an output of the voltage conversion circuit, the source of the third FET being connected to a power input pin of the first slot and grounded via a third resistor.

* * * * *